United States Patent
Basker et al.

(10) Patent No.: US 9,490,253 B1
(45) Date of Patent: Nov. 8, 2016

(54) GATE PLANARITY FOR FINFET USING DUMMY POLISH STOP

(71) Applicant: INTERNATIONAL BUSINESS MACHINES CORPORATION, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/863,079

(22) Filed: Sep. 23, 2015

(51) Int. Cl.
| | |
|---|---|
| *H01L 21/338* | (2006.01) |
| *H01L 21/3205* | (2006.01) |
| *H01L 21/336* | (2006.01) |
| *H01L 27/088* | (2006.01) |
| *H01L 21/321* | (2006.01) |
| *H01L 21/3105* | (2006.01) |
| *H01L 21/02* | (2006.01) |
| *H01L 29/66* | (2006.01) |
| *H01L 29/06* | (2006.01) |
| *H01L 21/762* | (2006.01) |
| *H01L 27/12* | (2006.01) |
| *H01L 21/84* | (2006.01) |
| *H01L 21/8234* | (2006.01) |

(52) U.S. Cl.
CPC ..... *H01L 27/0886* (2013.01); *H01L 21/02532* (2013.01); *H01L 21/02592* (2013.01); *H01L 21/02595* (2013.01); *H01L 21/31053* (2013.01); *H01L 21/32115* (2013.01); *H01L 21/76224* (2013.01); *H01L 21/823431* (2013.01); *H01L 21/823437* (2013.01); *H01L 21/845* (2013.01); *H01L 27/1211* (2013.01); *H01L 29/0649* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 7,166,506 B2 | 1/2007 | Prince et al. | |
| 8,252,689 B2 | 8/2012 | Yang et al. | |
| 8,513,127 B2 | 8/2013 | Chang et al. | |
| 8,614,127 B1* | 12/2013 | Yang | H01L 29/66545 257/E21.429 |
| 8,835,237 B2 | 9/2014 | Jagannathan et al. | |
| 8,841,726 B2 | 9/2014 | Leobandung | |

(Continued)

OTHER PUBLICATIONS

Economikos, H. et al., "Al CMP for Low Resistance Gate Fill for 20nm and Beyond Replacement Metal Gate," MRS Proceedings, vol. 1560, Apr. 2013. (pp. 1-3). Huey, S. et al., "CMP Process Control for Advanced CMOS Device Integration," ECS J. Solid State Sci. Technol. vol. 3, Issue 10, Jul. 2014. (pp. 1-10).

*Primary Examiner* — Khaja Ahmad
(74) *Attorney, Agent, or Firm* — Tutunjian & Bitetto, P.C.; Vazken Alexanian

(57) ABSTRACT

A method for forming a semiconductor device includes depositing a dielectric layer over fins formed in a semiconductor substrate. The dielectric layer includes a screen layer over tops of the fins. An etch stop feature is formed on the screen layer. The etch stop feature is patterned down to the screen layer in regions across the device. A dummy gate material formed over the fins is planarized down to the etch stop feature, a dielectric fill between gate structures patterned from the dummy gate material is planarized down to the etch stop feature and a gate conductor is planarized to the etch stop feature.

8 Claims, 12 Drawing Sheets

(56) References Cited

U.S. PATENT DOCUMENTS

| | | |
|---|---|---|
| 8,846,477 B2 | 9/2014 | Cai et al. |
| 2012/0032267 A1* | 2/2012 | Cheng .............. H01L 21/31111 257/368 |
| 2013/0189841 A1 | 7/2013 | Balseanu et al. |
| 2013/0221413 A1 | 8/2013 | Jagannathan et al. |
| 2013/0228878 A1 | 9/2013 | Wang et al. |
| 2013/0309856 A1 | 11/2013 | Jagannathan et al. |

* cited by examiner

GATE PLANARITY FOR FINFET USING DUMMY POLISH STOP

BACKGROUND

1. Technical Field

The present invention relates to semiconductor processing, and more particularly to methods and devices that provide a reference plane for gate height control and planarity.

2. Description of the Related Art

Dummy gate height for fin field effect transistor (FinFET) technologies has not scaled directly from node to node. This often leads to problems including gate structures that are too short. A minimum height is needed to ensure that there is sufficient height for all subtractive processes and their tolerances.

SUMMARY

A method for forming a semiconductor device includes depositing a dielectric layer over fins formed in a semiconductor substrate. The dielectric layer includes a screen layer over tops of the fins. An etch stop feature is formed on the screen layer. The etch stop feature is patterned down to the screen layer in regions across the device. A dummy gate material formed over the fins is planarized down to the etch stop feature, a dielectric fill between gate structures patterned from the dummy gate material is planarized down to the etch stop feature and a gate conductor is planarized to the etch stop feature.

Another method for forming a semiconductor device includes depositing a dielectric layer over fins formed in a semiconductor substrate, the dielectric layer including a screen layer over tops of the fins; forming a base layer on the screen layer and an etch stop layer on the base layer; patterning the etch stop layer and the base layer down to the screen layer in a plurality of regions across the device; recessing the dielectric layer to expose the fins; depositing conformal screen dielectric over the fins and the etch stop layer; depositing dummy gate material; planarizing the dummy gate material and stopping on the etch stop layer; patterning gate structures through the dummy gate material; forming a spacer layer over the gate structures; filling spaces between the gate structures with a dielectric fill; recessing the spacers to form divots and expose the dummy gate material; filling the divots; planarizing the dielectric fill and the dummy gate material stopping on the etch stop layer; forming gate stacks including a gate conductor; and planarizing the gate conductor stopping on the etch stop layer.

A semiconductor device includes fins formed in a semiconductor substrate and buried in a dielectric layer recessed to form a shallow trench isolation region, and a screen layer providing a thickness over tops of the fins. Gate structures are formed over the fins. At least one etch stop feature is formed on the screen layer to be above a fin height. The at least one etch stop feature includes a base layer and an etch stop layer formed on the base layer. The at least one etch stop feature includes a height to ensure the gate structures formed for the device have a minimum gate height after gate formation processing.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
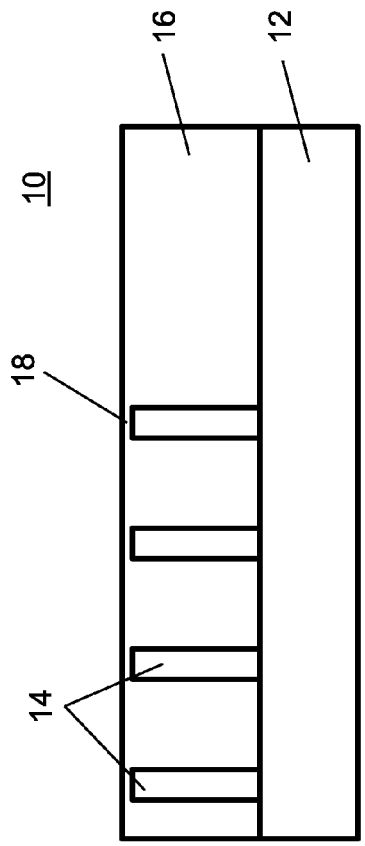
FIG. 1 is a cross-sectional view of a semiconductor device having fins formed and buried in a dielectric layer in accordance with the present principles.

In accordance with the present principles, methods and devices are provided that employ an additional mask process to create a solid reference plane or etch stop(s) for various planarization steps. In accordance with useful embodiments, etch stop features are provided to self-limit the planarization processes to ensure that a sufficient height of the gate structures remains thereafter. The present processes permit a more uniform surface, which provides better control for further etching and planarization of structures, especially, e.g., dummy gate planarization, which can now provide a shallow trench isolation-like polish. The planarization processes may include a chemical mechanical polish (CMP). In one embodiment, CMP stop features are employed that overlap with gates that are not active to limit the planarization progress. In other embodiments, the additional mask may be employed to create other features, such as e.g., polysilicon resistors, capacitors, etc.

In one embodiment, the etch stop features provide a minimum gate height. For example, the gate height needs to be tall enough to permit at least the following processes: amorphous Si planarization over fins (dummy gate material); poly open chemical mechanical planarization (POC) and reactive ion etching (RIE); replacement metal gate (RMG) processing and planarization, and any other processing.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated semiconductor device 10 is shown in accordance with the present principles. The device 10 includes a bulk substrate 12, preferably monocrystalline Si, although other substrate materials may be employed. The bulk substrate 12 is patterned and etched to form fins 14 therein. The fin patterning process may include a direct lithographic patterning process or a spacer imaging transfer (SIT) patterning process to etch portions of the substrate 12.

A dielectric layer 16, e.g., an oxide layer is formed on the substrate 12 and over the fins 14 to form a screen (e.g., screen oxide). The dielectric layer 16 forms a shallow trench isolation (STI) region for later-formed fin field effect transistors (finFETs). The dielectric layer 16 is planarized to provide a planar surface. The planar surface includes a thickness 18 over top portions of the fins 14. The thickness 18 may be from about 1 nm to about 30 nm, although other thicknesses may be employed. The thickness 18 may be a separately deposited dielectric material from the STI material of dielectric layer 16. The thickness 18 and the dielectric layer 16 are both preferably oxide or at least a same material.

Figure 2:
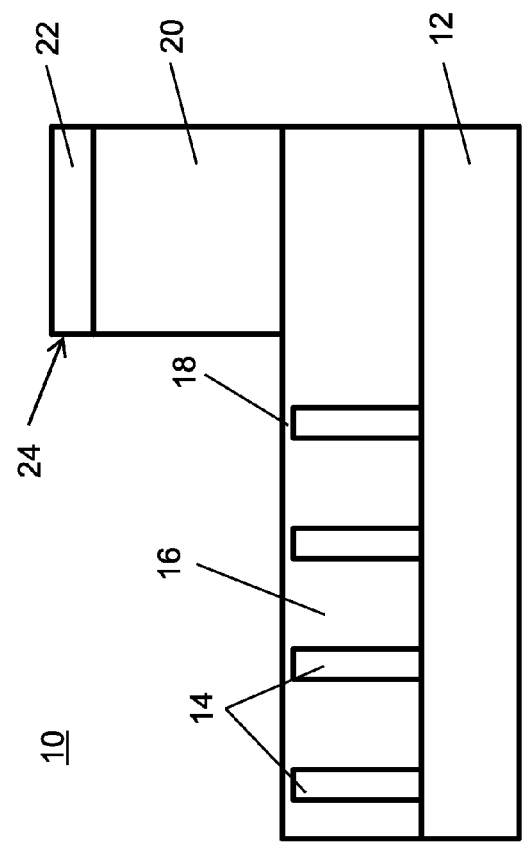
FIG. 2 is a cross-sectional view of the semiconductor device of FIG. 1 having an etch stop feature patterned in accordance with the present principles.

Referring to FIG. 2, an etch stop base layer (or base layer) 20 is formed on the dielectric layer 16 followed by an etch stop layer 22. The base layer 20 may include an amorphous silicon or a polysilicon material. The etch stop layer may include a nitride material (e.g., SiN). The etch stop layer 22 and the base layer 20 are patterned to form a stop feature 24.

A plurality of stop features 24 are formed across the device 10. The stop features 24 may be placed in areas where gates are inactive or in other regions where space may be available. The stop features 24 may have any shape when viewed in a top view. In the example depicted, the stop feature 24 does not run over fins 14. However, in other applications, the stop feature 24 may run over fins 14 (e.g., formed with fins). The fins 14 where the stop feature 24 runs over are most likely inactive fins, but having these fins in the stop feature may further improve the planarity of structure 10.

Figure 3:
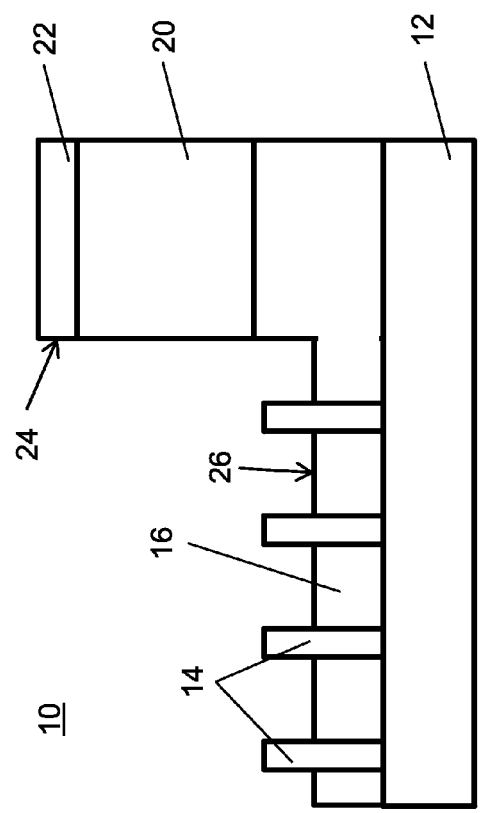
FIG. 3 is a cross-sectional view of the semiconductor device of FIG. 2 having the dielectric layer recessed to form a shallow trench isolation in accordance with the present principles.

Referring to FIG. 3, a fin reveal etch is performed to form a recess 26 to expose an upper portion of the fins 14. The dielectric layer 16 is etched selectively to the fins 14 and the layers 20 and 22 of the stop features 24. The fin reveal etch may include a reactive ion etch (RIE) process, a diluted HF wet etch, a combination of these or other etch processes.

Figure 4:
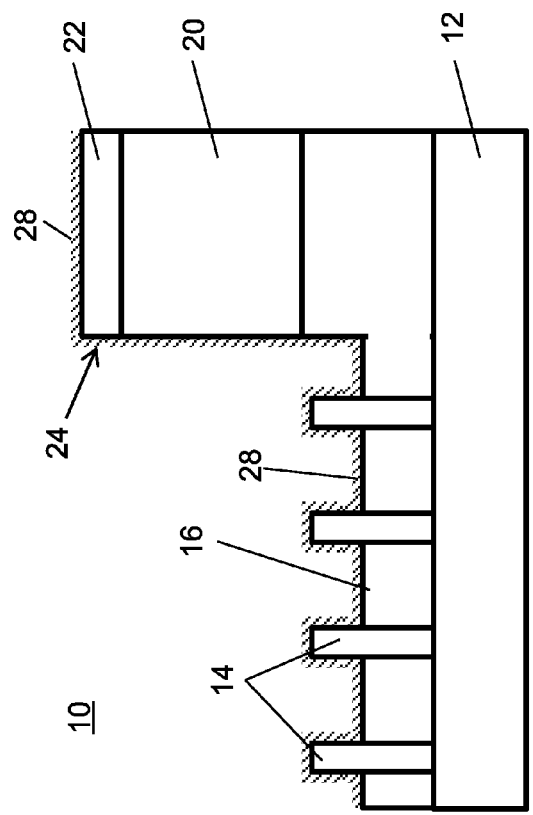
FIG. 4 is a cross-sectional view of the semiconductor device of FIG. 3 showing a liner formed over the fins and the etch stop feature in accordance with the present principles.

Referring to FIG. 4, a conformal dielectric layer 28 is formed over the device 10 and covers the fins 14 and the stop features 24. The conformal dielectric layer 28 forms a screen to protect the fins 14 in subsequent processing. The conformal dielectric layer 28 preferably includes an oxide similar to the dielectric layer 16.

Figure 5:
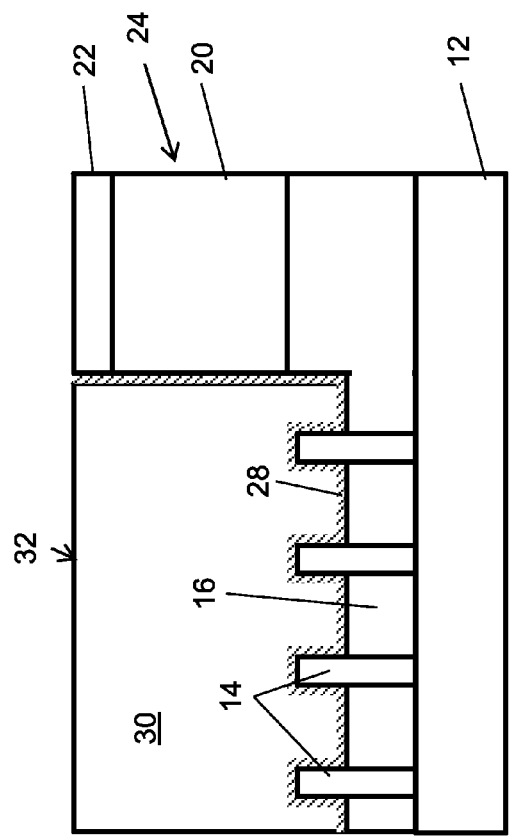
FIG. 5 is a cross-sectional view of the semiconductor device of FIG. 4 showing a dummy gate material formed over the fins and planarized to the etch stop feature in accordance with the present principles.

Referring to FIG. 5, a dummy gate layer 30 is deposited on the device 10. The dummy gate layer 30 may include amorphous silicon or polysilicon. The dummy gate layer 30 is then planarized to form a planar surface. The planarization process may include a chemical mechanical polish (CMP) process. The planarization process (CMP) stops on the etch stop layer 22 of the stop feature 24. The CMP provides an STI-like polish process across the device 10.

Figure 6:
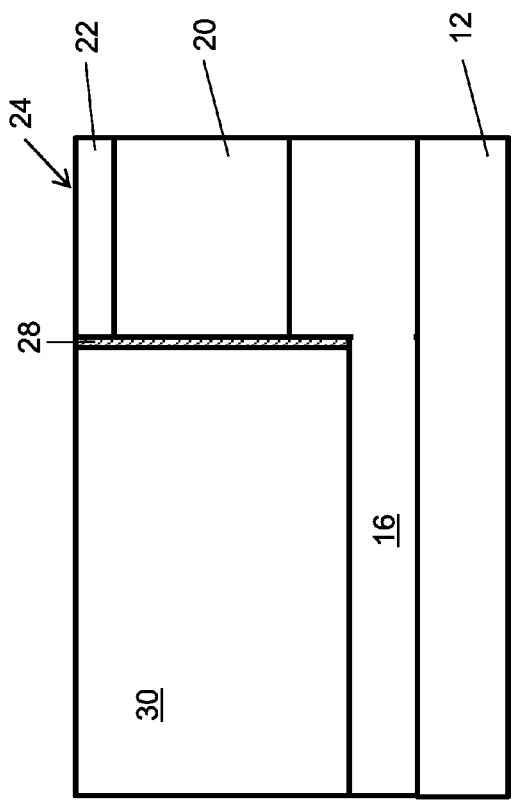
FIG. 6 is a cross-sectional view of the semiconductor device of FIG. 5 taken at a section line 90 degrees from the view in FIG. 5, the section line being along the fins longitudinally in accordance with the present principles.

Referring to FIG. 6, the device 10 of FIG. 5 is shown in a rotated view of 90 degrees with a cross-section taken in between fins 14 through the dielectric layer 16. The cross-sectional view depicted in FIG. 6 will be employed in subsequent FIGS.

Figure 7:
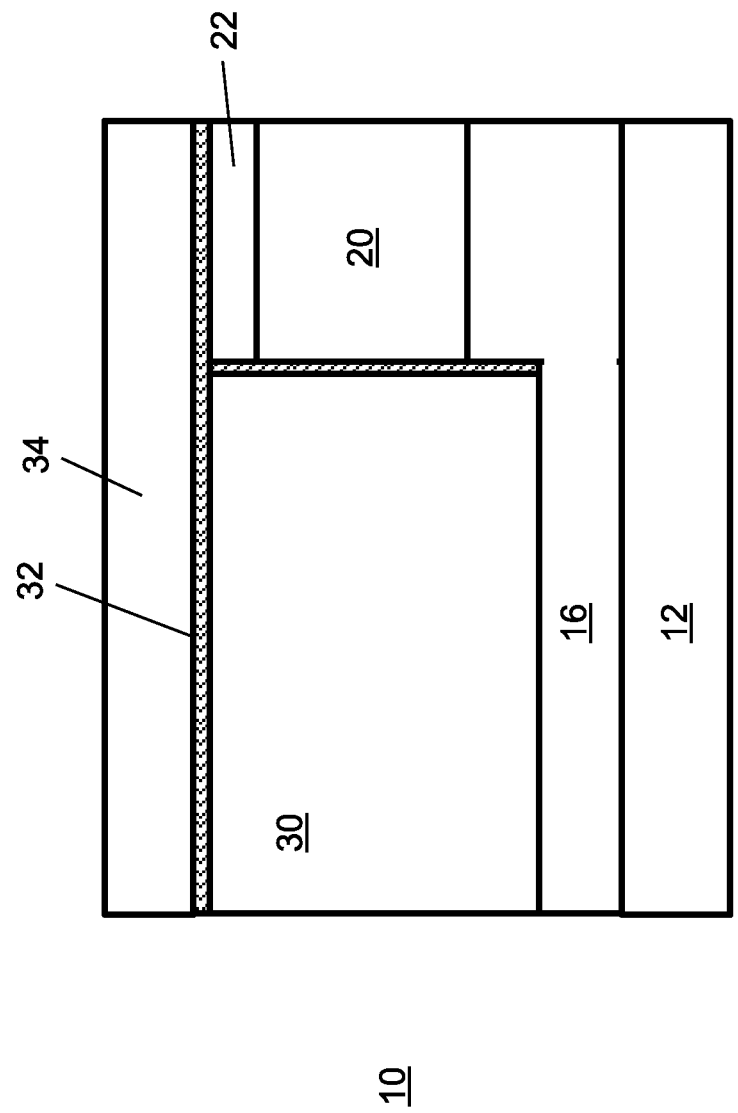
FIG. 7 is a cross-sectional view of the semiconductor device of FIG. 6 showing a blanket dielectric layer and a hardmask formed in accordance with the present principles.

Referring to FIG. 7, a blanket dielectric layer 32 is deposited over the surface of device 10. A hardmask layer 34 is formed on the blanket dielectric layer 32. In one embodiment, the blanket dielectric layer 32 includes an oxide material while the hardmask layer 34 includes a nitride material. Other materials may be employed that permit selective removal of the layer 32 and 34 with respect to underlying materials.

Figure 8:
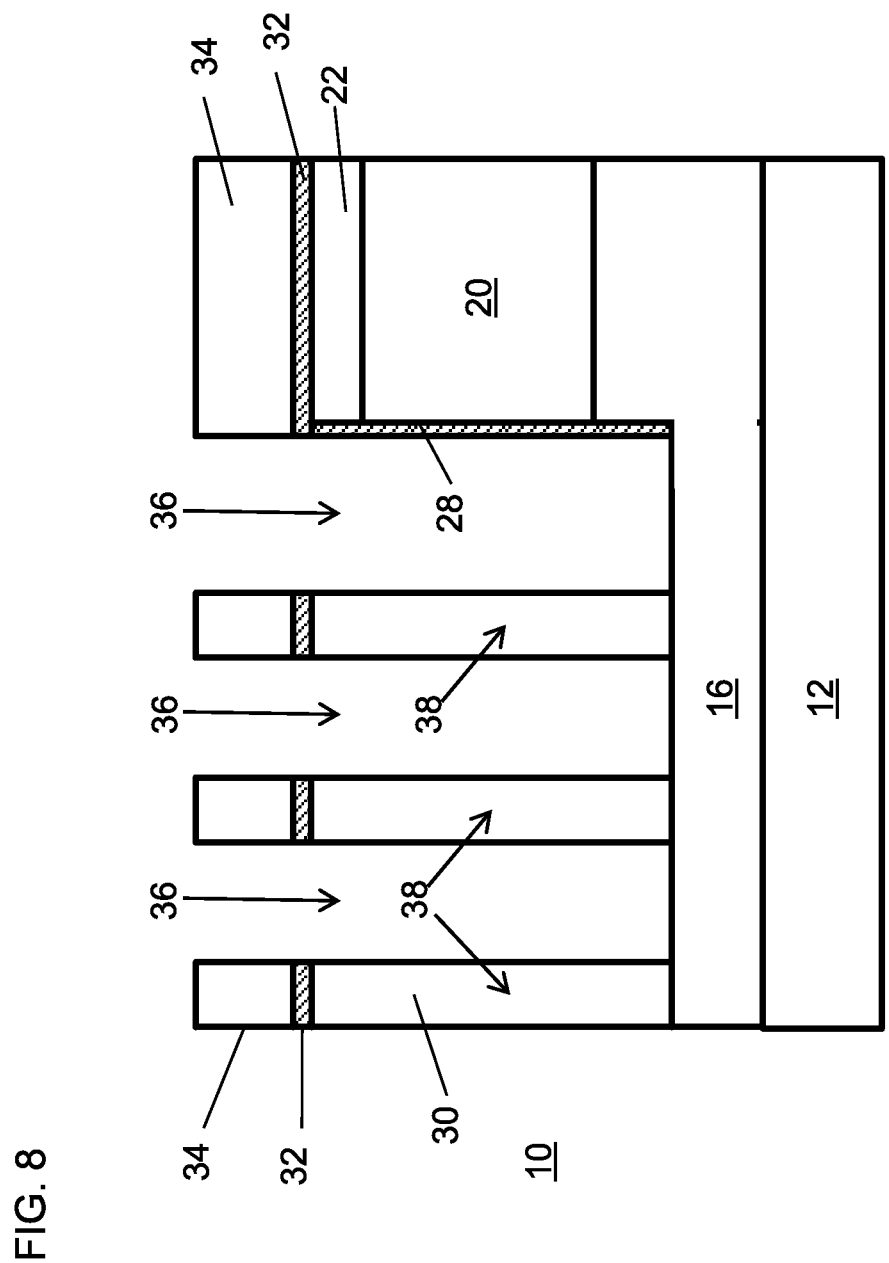
FIG. 8 is a cross-sectional view of the semiconductor device of FIG. 7 showing the blanket dielectric layer, hardmask and dummy gate material patterned in accordance with the present principles.

Referring to FIG. 8, the hardmask 34 is patterned, e.g., using a lithography process. The patterned hardmask 34 provides an etch mask for forming dummy gate structures 38 by etching trenches 36 into layer 30. The etch process for forming trenches 36 may include a RIE process.

Figure 9:
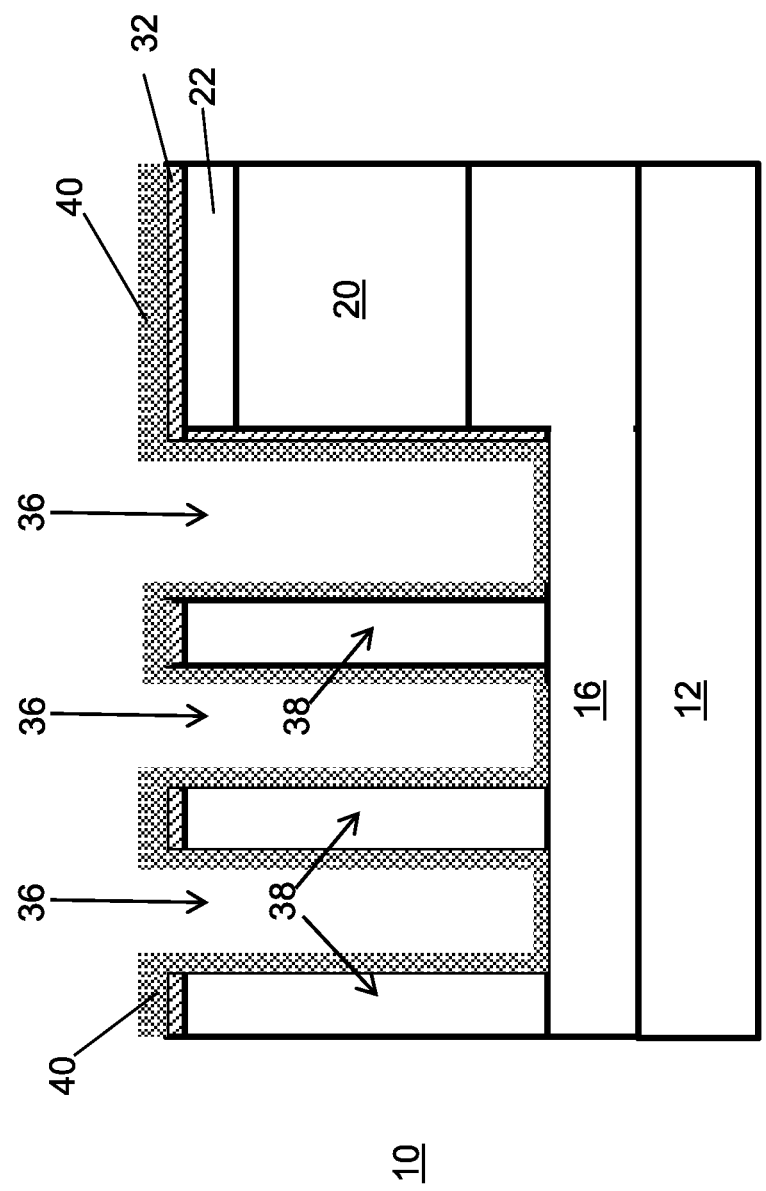
FIG. 9 is a cross-sectional view of the semiconductor device of FIG. 8 showing a spacer layer formed in accordance with the present principles.

Referring to FIG. 9, the hardmask 34 is etched down or removed selectively to the blanket dielectric layer 32. A spacer layer 40 is deposited over the dummy gate structures 38. Liner 40 includes, for example, nitride or other suitable material. The spacer layer 40 is then etched (e.g., RIE) to remove the spacer 40 in the area of the fins 14 to expose the fins (not shown). Since this spacer 40 is removed in a vertical fashion, the original (nitride) hardmask 34 and spacer 40 are pulled down vertically. Once the fins are fully exposed, an extension can be formed through in-situ doped silicon growth (e.g., BSiGe, phosphorus-doped Si, etc.). The epitaxial growth on the fins can also structurally complete source and drain (S/D) formation on the fins as they create a "platform" for a contact to land on.

After the epitaxial deposition (not shown), additional liner(s) can be deposited, if needed. For example, a liner (e.g., nitride) may be deposited to encapsulate the S/D regions (not shown) from the (flowable) dielectric deposition that follows in FIG. 10.

Figure 10:
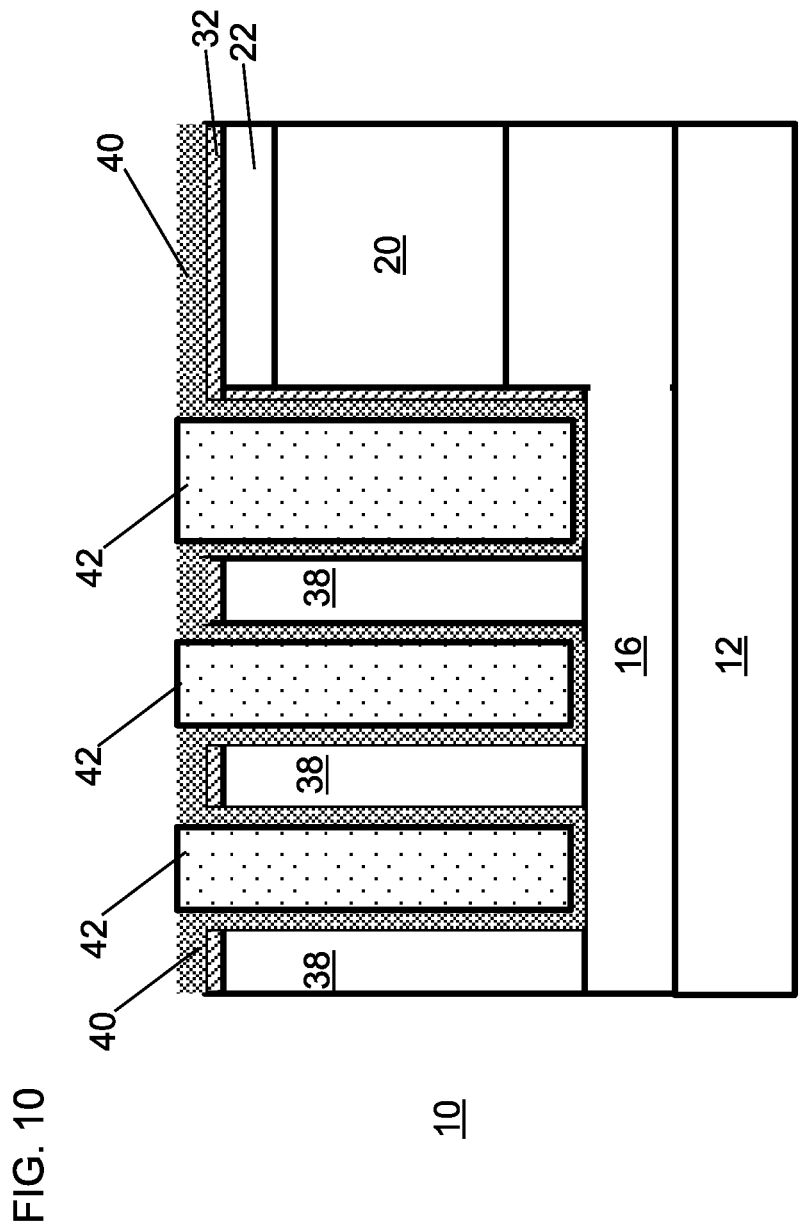
FIG. 10 is a cross-sectional view of the semiconductor device of FIG. 9 showing a dielectric fill formed in accordance with the present principles.

Referring to FIG. 10, a flowable dielectric material 42 or high a density plasma (HDP) material is deposited to fill trenches 36. Material 42 preferably includes an oxide material. The material 42 is then planarized using the poly-open CMP liner 40 as an etch/polish stop.

Figure 11:
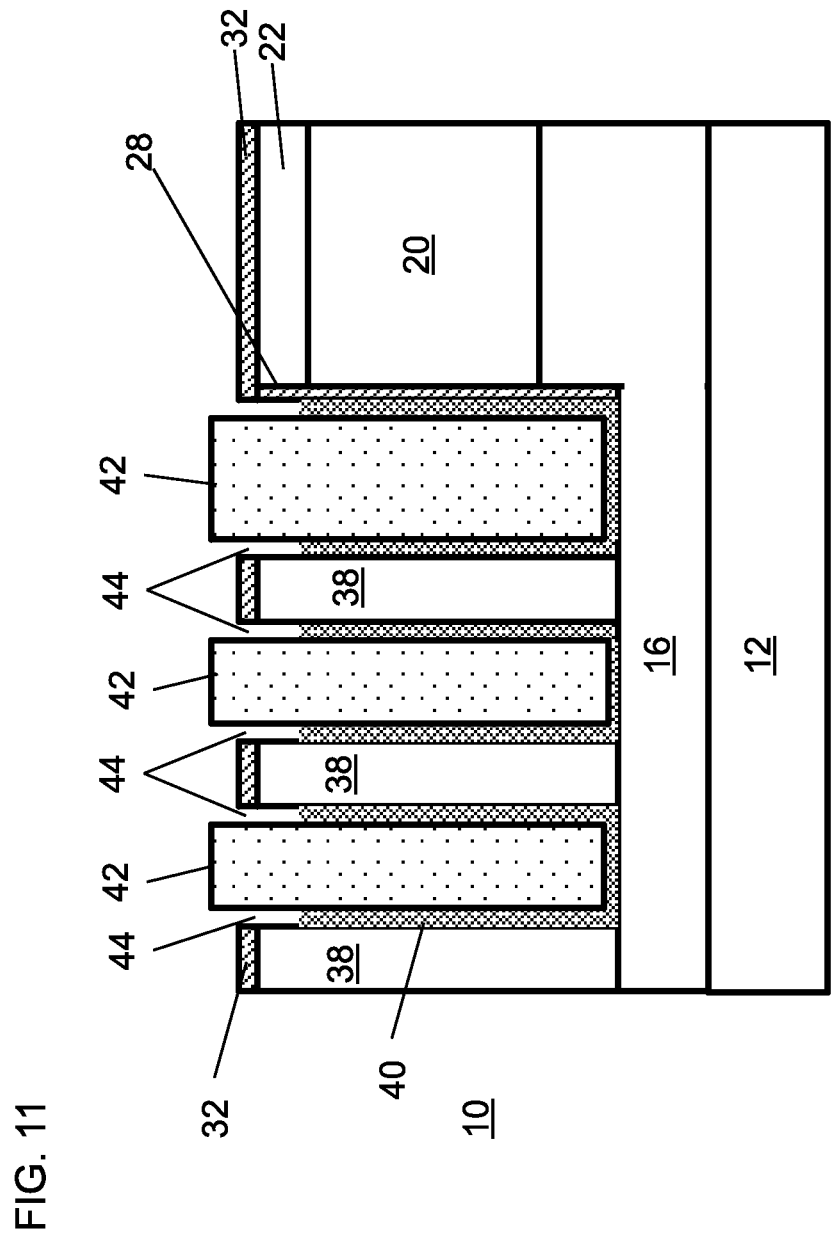
FIG. 11 is a cross-sectional view of the semiconductor device of FIG. 10 showing the spacer layer recessed in accordance with the present principles.

Referring to FIG. 11, an etch process is performed to open up the dummy gates 38. The etch process may include a RIE. The etch process removes the liner 40 and any remaining remnants of hardmask 34 (if present) from on top of material 42 and recesses the liner 40 to form divots between the dummy gates 38 and the material 42.

Figure 12:
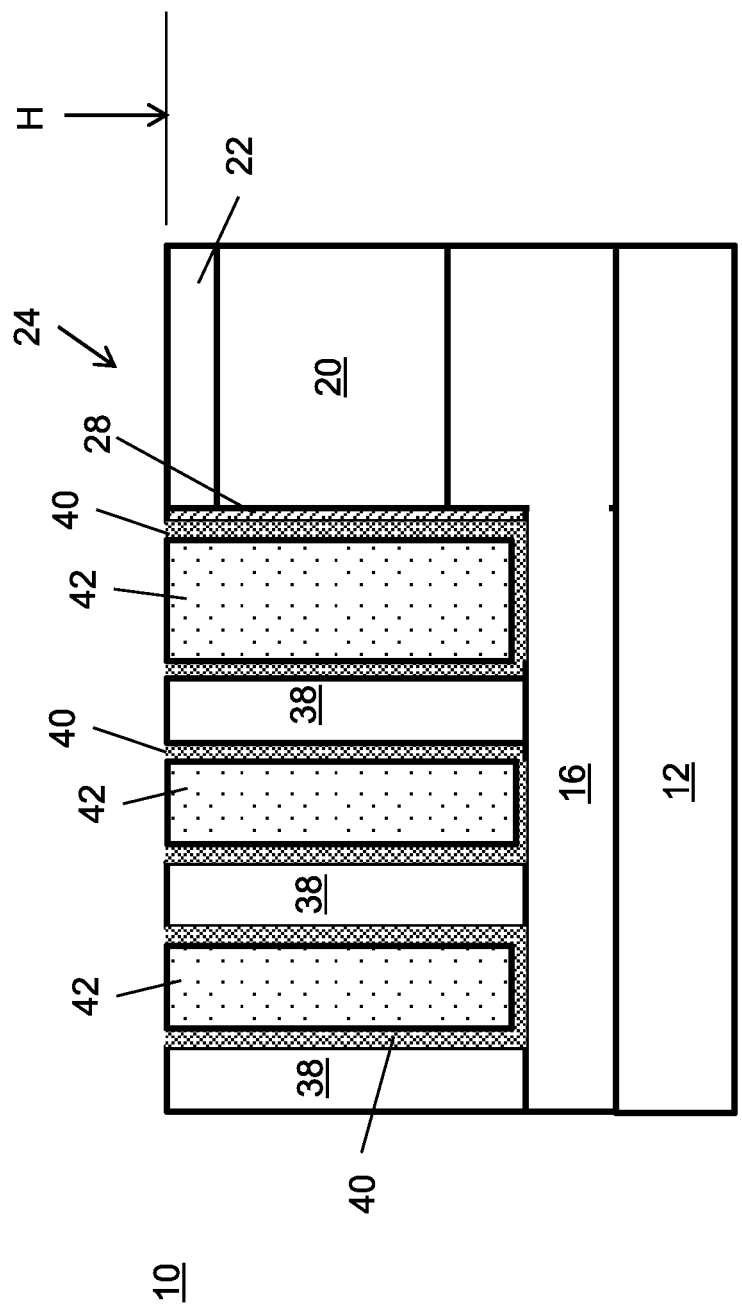
FIG. 12 is a cross-sectional view of the semiconductor device of FIG. 11 showing the dielectric fill planarized to the etch stop layer in accordance with the present principles.

Referring to FIG. 12, the divots 44 are filled by depositing the same material as layer 40 (e.g., nitride). Then, a CMP process is performed to polish/planarize the material 42, layer 32 and dummy gate layer 30. The CMP stops of the etch stop layer 22. The etch stop layer 22 and the base layer (and the dielectric layer 16) are formed to a height H that ensures sufficient material for the gate structures. The CMP process stopping on the etch stop layer 22 ensures that the gate structures have a height that is close to the desired height for the design. In addition, a plurality of etch stop features across the device 10 ensures a uniform planarity to maintain the height across the device 10.

Figure 13:
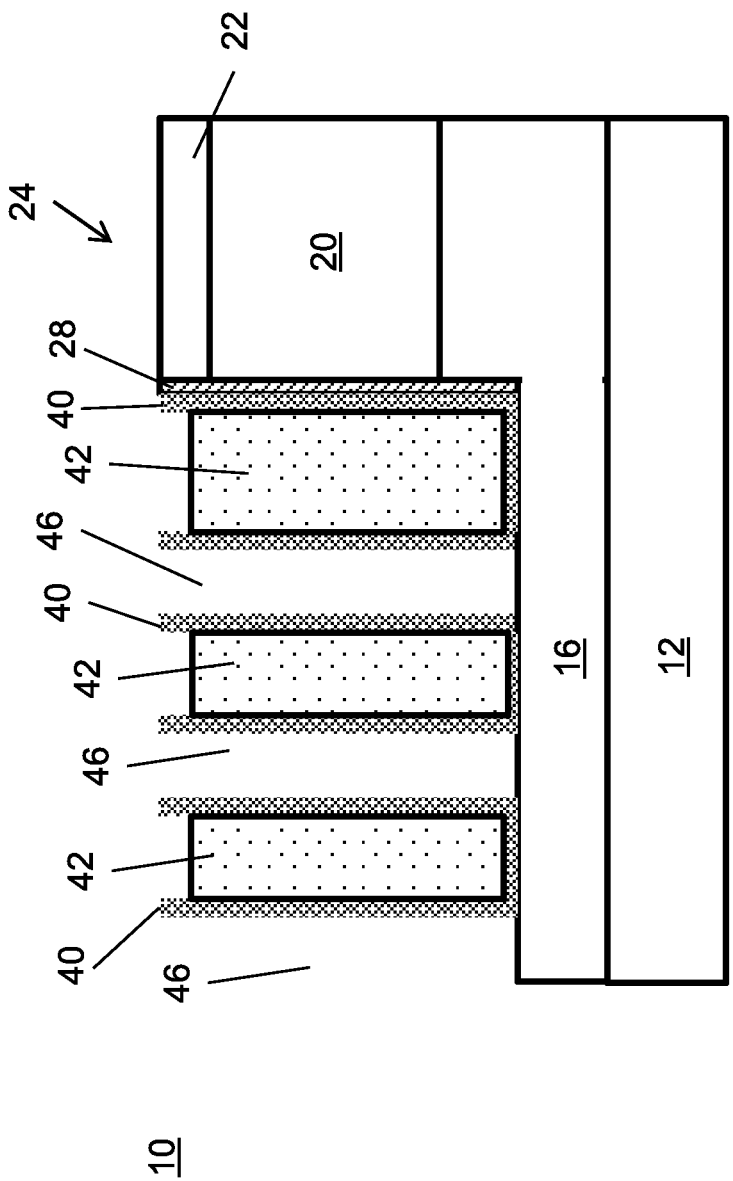
FIG. 13 is a cross-sectional view of the semiconductor device of FIG. 12 showing the dummy gate material pulled in accordance with the present principles.

Referring to FIG. 13, a selective etch process is performed to remove the dummy gate layer 30 in a gate pull process. The etch process may remove a portion of the material 42. The dummy gate removal is part of replacement metal gate (RMG) process; however, the present principles are applicable to gate-first processes where metal gates are formed instead of dummy gates. The gate pull process removes the dummy gate material (e.g., polysilicon) selective to the material 42, layer 40 and layer 22 (e.g., oxide and nitride). The removal of the dummy gates forms openings 46 down to layer 16. This exposes the fins (not shown) for the formation of a gate dielectric and gate conductor.

Figure 14:
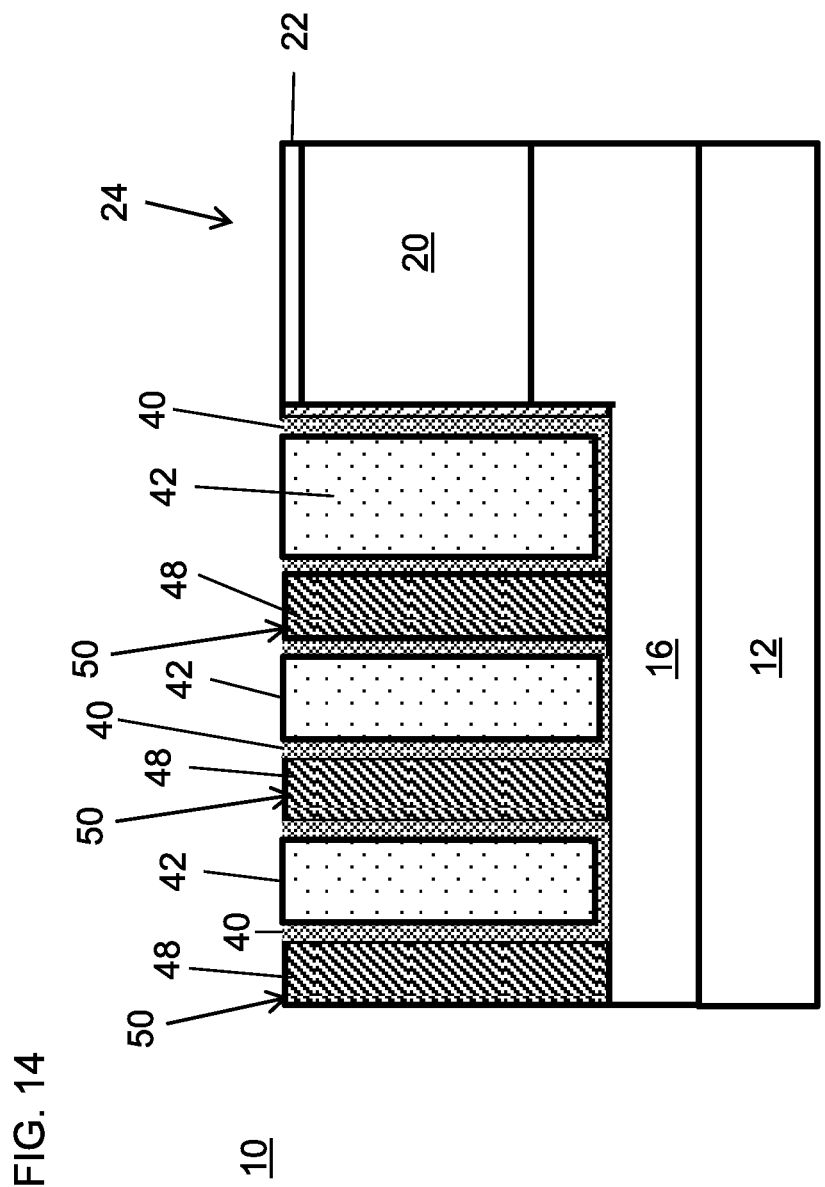
FIG. 14 is a cross-sectional view of the semiconductor device of FIG. 13 showing a gate conductor deposited and planarized to the etch stop layer in accordance with the present principles.

Referring to FIG. 14, a gate dielectric (not shown) is formed in contact with the fins and a gate conductor 48 is formed over the gate dielectric layer. The gate conductor 48 may include a metal, such as W, Al, Ti, TiN, TiC, etc. The gate conductor 48 may include multiple layers, e.g., a work function metal and a main conductor. After the deposition of the gate conductor 48, a planarization process is performed to planarize a top surface and remove excess conductive material. The planarization process may include a CMP process. The CMP process stops on the etch stop layer 22. This preserves the height and the planarity of gate structures 50. Processing continues and may employ the etch stop layer 22 or any portion of the etch stop features 24 in accordance with the present principles.

In accordance with the present principles, the thickness of the etch stop layer 22 is determined to withstand the etching/polishing processes of the fabrication method. The etch stop layer 22 may be formed from multiple layers or have its dimensions configured to expose different layers, thicknesses or features at stop points during the polish or etch processes.

In one embodiment, the regions where features 24 are formed include inactive regions, e.g., regions where gates/devices are inactive. The silicon-based materials of the base layer 20 may be employed to form other devices, such as fuses, capacitors or resistors. The material of base layer 20 is no longer needed after the finFETs are formed. This will repurpose the already deposited material in base layer 20 for a useful function. The base layer 20 may be employed as is (with connections being formed in a later step), or may be etched to further define a shape or structure. In many instances, the base layer 20 will be mixed with a metal to form a metal silicide.

Figure 15:
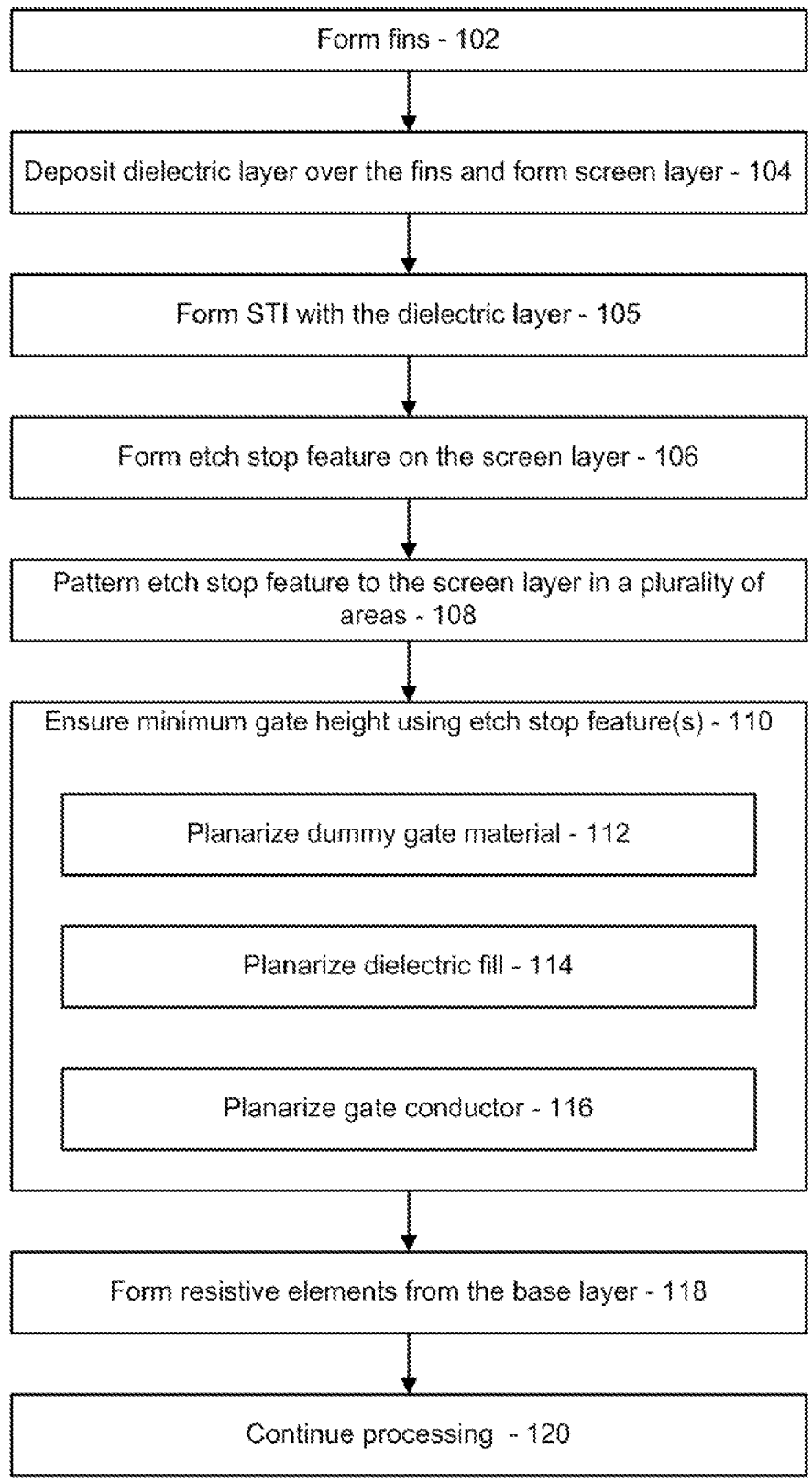
FIG. 15 is a block/flow diagram showing methods for forming a semiconductor device in accordance with illustrative embodiments.

Referring to FIG. 15, a method for forming a semiconductor device is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are formed in a substrate by patterning (e.g., lithographic patterning or spacer image transfer (SIT). In block 104, a dielectric layer is deposited over the fins formed in the semiconductor substrate. The dielectric layer includes a screen layer, which provides a thickness over tops of the fins. The dielectric layer may be recessed to expose the fins wherein the dielectric layer forms a shallow trench isolation structure in block 105.

In block 106, an etch stop feature is formed on the screen layer. The etch stop feature may include multiple layers including different materials (e.g., oxide and nitride layers). In one embodiment, the etch stop feature includes a base layer formed from polysilicon or amorphous silicon and an etch stop layer formed on the base layer from a nitride material (e.g., SiN).

In block 108, the etch stop feature is patterned down to the screen layer in a plurality of regions across the device. The plurality of regions may include regions on the device where gates are not active or other available areas in or around an active region (where source and drain regions are formed for fin field effect transistors (finFETs) formed using the fins). The plurality of regions assists in ensuring planarity across the device.

In block 110, the etch stop feature(s) is/are employed to ensure that a minimum gate height is preserved after gate formation processing. The height of the etch stop feature and in particular the base layer may represent the minimum gate height. The gate formation processing may include, e.g., at least planarizing dummy gate material formed over the fins down to the etch stop feature in block 112, planarizing a dielectric fill between gate structures patterned from the dummy gate material down to the etch stop feature in block 114; and planarizing a gate conductor to the etch stop feature in block 116. In addition to these processes, other processes may be employed, e.g., these processes may include forming spacer layers, epitaxially growing source and drain regions on the fins, etc. These other processes may also employ the etch stop features or any portion of the etch stop features.

In block 118, electrical elements/components (e.g., fuses, resistors, capacitors, etc.) may be formed from the base layer. This may include patterning the base layer, siliciding the base layer and making connections to structures formed form the base layer. In other embodiments, the etch stop features are removed. In block 120, processing continues to complete the device. This may include forming contacts, metallizations, etc.

Having described preferred embodiments for gate planarity for finFETs using dummy polish stop (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a semiconductor device, comprising:
   depositing a dielectric layer over fins formed in a semiconductor substrate, the dielectric layer including a screen layer over tops of the fins;
   forming an etch stop feature on the screen layer;
   patterning the etch stop feature down to the screen layer in a plurality of regions across the device;
   planarizing dummy gate material formed over the fins down to the etch stop feature;
   planarizing a dielectric fill between gate structures patterned from the dummy gate material down to the etch stop feature; and
   planarizing a gate conductor down to the etch stop feature.

2. The method as recited in claim 1, wherein the etch stop feature includes multiple layers including different materials.

3. The method as recited in claim 1, wherein the etch stop feature includes a base layer formed from polysilicon or amorphous silicon and an etch stop layer formed on the base layer.

4. The method as recited in claim 3, wherein the etch stop layer includes a nitride material.

5. The method as recited in claim 3, further comprising forming electrical components from the base layer.

6. The method as recited in claim 1, wherein the etch stop feature includes a height configured to preserve a minimum gate height after gate formation processing.

7. The method as recited in claim 1, wherein the plurality of regions includes regions on the device where gates are not active.

8. The method as recited in claim 1, further comprising recessing the dielectric layer to expose the fins wherein the dielectric layer forms a shallow trench isolation structure.

* * * * *